United States Patent
Heller et al.

(10) Patent No.: US 6,931,085 B2
(45) Date of Patent: Aug. 16, 2005

(54) PROCESS AND APPARATUS FOR CORRECTION OF A RESAMPLER

(75) Inventors: Klaus Heller, Gauting (DE); Kurt Schmidt, Grafing (DE)

(73) Assignee: Rohde & Schwarz GmbH & Co., KG, Munich (DE)

( * ) Notice: Subject to any disclaimer, the term of this patent is extended or adjusted under 35 U.S.C. 154(b) by 803 days.

(21) Appl. No.: 09/915,502

(22) Filed: Jul. 27, 2001

(65) Prior Publication Data

US 2002/0034271 A1 Mar. 21, 2002

(30) Foreign Application Priority Data

Jul. 27, 2000 (DE) .......................................... 100 36 703

(51) Int. Cl.[7] .............................................. H04L 7/00
(52) U.S. Cl. ................................................... 375/355
(58) Field of Search ............................... 375/355, 350, 375/229, 230, 231, 232, 233, 341

(56) References Cited

U.S. PATENT DOCUMENTS

| | | | |
|---|---|---|---|
| 4,949,177 A | * | 8/1990 | Bannister et al. ............. 348/584 |
| 5,287,387 A | * | 2/1994 | Birchler ....................... 375/296 |
| 5,559,513 A | * | 9/1996 | Rothermel et al. ............ 341/61 |
| 5,577,159 A | * | 11/1996 | Shoham ....................... 704/206 |
| 5,970,093 A | | 10/1999 | de Lantremange |
| 6,028,542 A | | 2/2000 | Fukui et al. |
| 6,208,671 B1 | * | 3/2001 | Paulos et al. ................ 370/545 |
| 6,377,312 B1 | * | 4/2002 | Limberg et al. ............. 348/614 |
| 6,741,650 B1 | * | 5/2004 | Painchaud et al. ...... 375/240.21 |
| 6,768,780 B1 | * | 7/2004 | Lakkis et al. ................ 375/355 |
| 2001/0031020 A1 | * | 10/2001 | Hwang et al. ............... 375/316 |
| 2001/0055354 A1 | * | 12/2001 | Fung et al. .................. 375/354 |

FOREIGN PATENT DOCUMENTS

| | | | |
|---|---|---|---|
| DE | 0610683 A2 | * 1/1994 | ............. H04L/7/02 |
| DE | 4326427 A1 | 2/1995 | |

* cited by examiner

*Primary Examiner*—Phuong Phu
*Assistant Examiner*—Anika Talapatra
(74) *Attorney, Agent, or Firm*—Birch, Stewart, Kolasch & Birch, LLP (57) ABSTRACT

An apparatus for correction of a resampler is provided, with which a sampled input signal, that is subjected to an input sampling rate and which has a chip frequency that differs from the input sampling rate, is converted into a sampled output signal for which the sampling rate corresponds with the chip frequency, by changing the input sampling rate by a resampling factor. The input signal is subjected to a non-linear operation so that a spectral line is produced at the chip frequency. A frequency shifter spectrally shifts the input signal by the chip frequency. The phase of the shifted spectral line at the chip frequency is determined as a function of sampling time points. On the basis of a regression of the phase of the shifted spectral line at the chip frequency, the resampling factor is corrected and/or the output signal is time-wise shifted by a time correction value.

10 Claims, 7 Drawing Sheets

PROCESS AND APPARATUS FOR CORRECTION OF A RESAMPLER

BACKGROUND OF THE INVENTION

This application claims a priority from German Patent Application No. 100 36 703.8, filed Jul. 27, 2000, and the contents of the application are incorporated herein by reference.

This invention concerns a process and an apparatus for the correction of resamplers.

Resamplers, that is sampling-rate converters are used to convert a sampled digital input signal having one input sampling rate into a sampled digital output signal with a different output sampling rate. With a process of this invention there is an input signal having a sampling rate, or frequency, which is larger by an arbitrary factor (not necessarily by a whole number, or integer) than a symbol frequency or a chip frequency. With a Wideband Code Division Multiple Access (WCDMA) signal, every data symbol in a chip sequence is coded so that each symbol is of a plurality of chips. A binary change between two amplitude values can take place between the chips. The invention, however, is also suitable for other digital signals with then the term "chip frequency" being replaced by the term "symbol frequency" or "symbol rate". Upon translating the input sampling rate into the symbol or chip frequency, the problem arises that the relationship between the input sampling rate and the symbol or chip frequency is only approximately known, since a timing generator of the resampler is not identical with a timing generator of the input sampling rate, and thus a drift between the two oscillators is possible. Further, an absolute phase position of the input sampling rate is unknown.

It is therefore an object of this invention to provide a process and an apparatus for the correction of a resampler with which a sampled input signal, which is subjected to an input sampling rate and which has a symbol or chip frequency that differs from that of the input sampling rate, is translated into a sampled output signal in which a sampling rate corresponds to the symbol or chip frequency by changing the input sampling rate by a resampling factor, with which a drift between the input sampling rate and the symbol or the chip frequency as well as an absolute, constant shifting of the phase of the input sampling rate are compensated.

SUMMARY OF THE INVENTION

According to principles of the process of this invention, a non-linear operation is performed on the input signal $S_D$, so that a spectral line arises at the symbol or chip frequency $f_C$; the input signal $S_D$ is spectrally shifted by the symbol or chip frequency $f_C$; the phase $\phi$ of the shifted spectral line is recorded at the symbol or chip frequency $f_C$ as a function of the sample time points; and a resampling factor (resamp_fac) or a time shift of the output signal $S_C$ is corrected by a time correction value (resamp_offset) based on a regression of the phase $\phi$ of the shifted spectral line at the symbol or chip frequency $f_C$ as a function of the sample time points.

An apparatus according to principles of this invention comprises: a non-linear operating element that subjects the input signal $S_D$ to a non-linear operation so that a spectral line results at the symbol or chip frequency $f_C$; a frequency shifter, which spectrally shifts the input signal $S_D$ by the symbol or chip frequency $f_C$; a phase recording, or determining, device that determines the phase $\phi$ of the shifted spectral line at one of the symbol and chip frequency $f_C$ as a function of the sampling time points; and a regression and correcting device that, on the basis of a regression of the phase $\phi$ of the shifted spectral line at the symbol or chip frequency $f_C$ corrects the resampling factor (resamp_fac) as a function of the sample time points and/or time-wise shifts the output signal $S_C$ by a time correction value (resamp_offset).

According to the invention, the input signal is subjected to the non-linear operation, for example a squaring. The non-linear operation produces spectral lines of the natural frequencies of the input signal. In this regard, a spectral line is produced at the symbol or chip frequency. Because the input signal can change its status only at the end of the symbol, or for a symbol of a combined plurality of chips of a CDMA signal only at the end of a chip, the input signal is modulated by the symbol frequency or the chip frequency and the symbol or chip frequency can be created as the spectral line by the non-linear operation. A further recognition leading to the invention is that by shifting the spectrum of the input signal such that the symbol or chip frequency falls near (in an error-free ideal case exactly) the rate zero, a particularly uncomplicated evaluation of the spectral line results. By determining the phase of the thusly shifted spectral line, an absolute time offset, that was in the input signal, as well as a relative time offset which adds from sampling interval to sampling interval, can be directly estimated by linear regression.

Before the phase is determined, or recorded, preferably a decimating of the sampling value is performed by intermediate sampling with prior band limits. A filter that is used for this preferably has a frequency response with zero positions at the simple symbol or chip frequency and at double the symbol or chip frequency. Because of the prior spectral shifting by the symbol or chip frequency, the firstly cited zero position falls on the DC portion and the doubled symbol or chip frequency falls on the spectral line of the mirrored symbol or chip frequency.

BRIEF DESCRIPTION OF THE DRAWINGS

Further benefits, characteristics and details of the invention are explained in more detail below using an embodiment shown in the drawings. The described and drawn features can be used individually or in preferred combinations in other embodiments of the invention. The foregoing and other objects, features and advantages of the invention will be apparent from the following more particular description of the preferred embodiment of the invention, as illustrated in the accompanying drawings in which reference characters refer to the same parts throughout the different views. The drawings are not necessarily to scale, emphasis instead being placed upon illustrating principles of the invention in a clear manner.

DETAILED DESCRIPTION OF THE INVENTION

Figure 1:
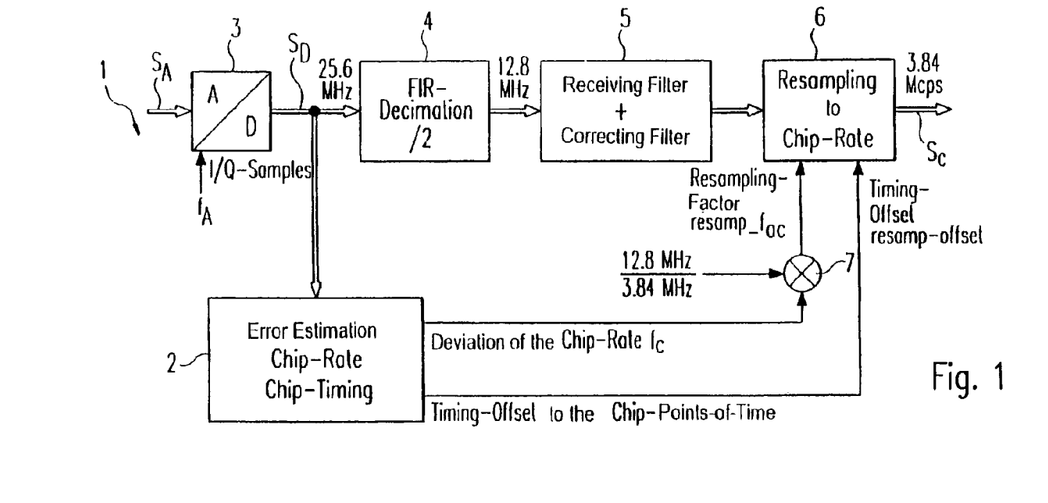
FIG. 1 is a block diagram showing how a correction apparatus of this invention is used.

FIG. 1 shows a portion of a receiving apparatus 1 with which a correction apparatus 2 of this invention is used.

An analog input signal $S_A$ is converted into a digital, sampled input signal $S_D$ in an analog/digital converter 3. Following, in a decimating device 4, in this embodiment, the sampling rate is decimated, or reduced, by a factor of 2 and, in a thereon following receiving and correcting filter 5, whose function in this invention is not of further interest here, it is filtered and thusly fed to a resampler (sampling rate converter) 6.

Since the sampled input signal only in the middle of the chips, from which the symbols of the WCDMA signal are composed, is of interest, the sampling rate in the resampler 6 is reduced to the chip frequency $f_C$. Insofar as a sampling rate $f_A$ of the input signal $S_D$ relative to the chip frequency $f_C$ is subject to no drift, the relationship between the chip frequency $f_C$ and the sampling rate $f_A$ of the input signal $S_D$ is 25.6/3.84=6.66 in the shown embodiment. Because there is a drift in the sampling rate $f_A$ relative to the chip frequency $f_C$, however, an error estimation of the chip rate $f_C$ and the absolute time of phase shift, which is represented in FIG. 1 as "chip-timing" or "timing offset to the chip time points", is necessary. The correcting apparatus 2 of this invention, which first estimates this error and corrects it, serves this purpose.

In the embodiment shown in FIG. 1, the deviation from the chip-rate or chip frequency $f_C$ is transmitted to a multiplier 7. This transmitted correction factor is 1 if there is no error so that a resampling factor, resamp_$f_{ac}$, transmitted to the resampler 6 is the ideal relationship between the input sampling rate $f_A$ and the chip rate $f_C$ in this case. If an error appears, the correction factor provided to the multiplier 7 correspondingly deviates from 1. In addition, a time shift, or timing-offset, resamp_offset, is transmitted to the resampler 6 so as to be able to compensate for a constant time offset.

Figure 3:
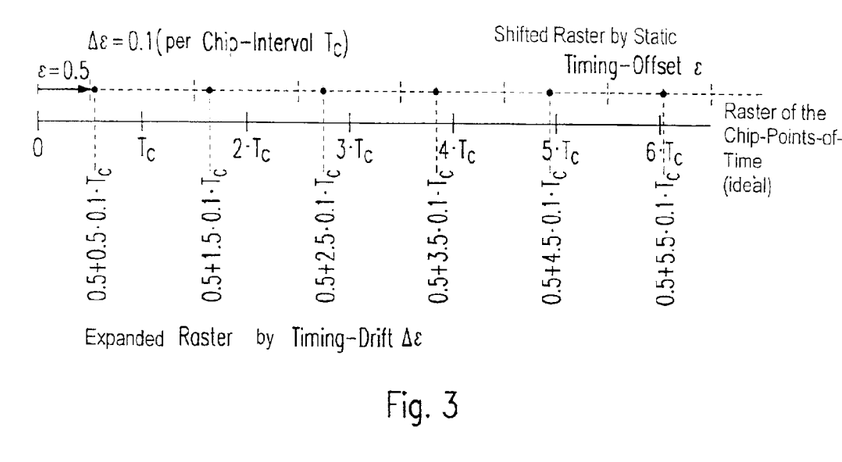
FIG. 3 is a time diagram explaining a drift and a necessary correction of an input signal.

In FIG. 3 a static time shift, or timing-offset $\epsilon$, and the time offset drift, or timing-drift $\Delta\epsilon$, is shown. The timing offset $\epsilon$ in the example shown in FIG. 3 totals 0.5, that is a half of a chip interval $T_C$. This constant, static timing offset $\epsilon$ is in this example overlaid by a timing-drift $\Delta\epsilon=0.1$. This means that the total time offset, which is composed of the static timing offset $\epsilon$ and the timing-drift $\Delta\epsilon$ increases from chip interval to chip interval by 0.1, that is by 10% of a chip interval $T_C$.

The correcting apparatus 2 of this invention compensates for the static timing offset $\epsilon$ as well as also the timing drift $\Delta\epsilon$. The estimation and correcting apparatus 2 of this invention is shown in more detail in FIG. 2. The digital sampled input signal $S_D$ is fed to a non-linear operating element 8 that subjects the input signal $S_D$ to a non-linear operation. This non-linear operation can, for example, be the forming of summed squares in which an in-phase component I and a quadrature phase component Q of the base band signal $S_D$ are respectively squared and then summed ($I^2+Q^2$). In a following multiplier 9, the factor $e^{i \cdot k \cdot 2\pi \cdot fA1 \ fC}$ is applied to the output signal of the non-linear operating element 8, which means that a frequency spectrum of the output signal of the non-linear operating element 8 is spectrally shifted by the chip frequency $f_C$. The multiplier 9 therefore operates as a frequency shifter. In a following decimating device 10, in the shown embodiment, decimation of the sampling value takes place in a relationship 1/256, that is a sub-sampling in a relationship of 1/256. In order to avoid an aliasing, an appropriate band limiting was previously performed.

Figure 2:
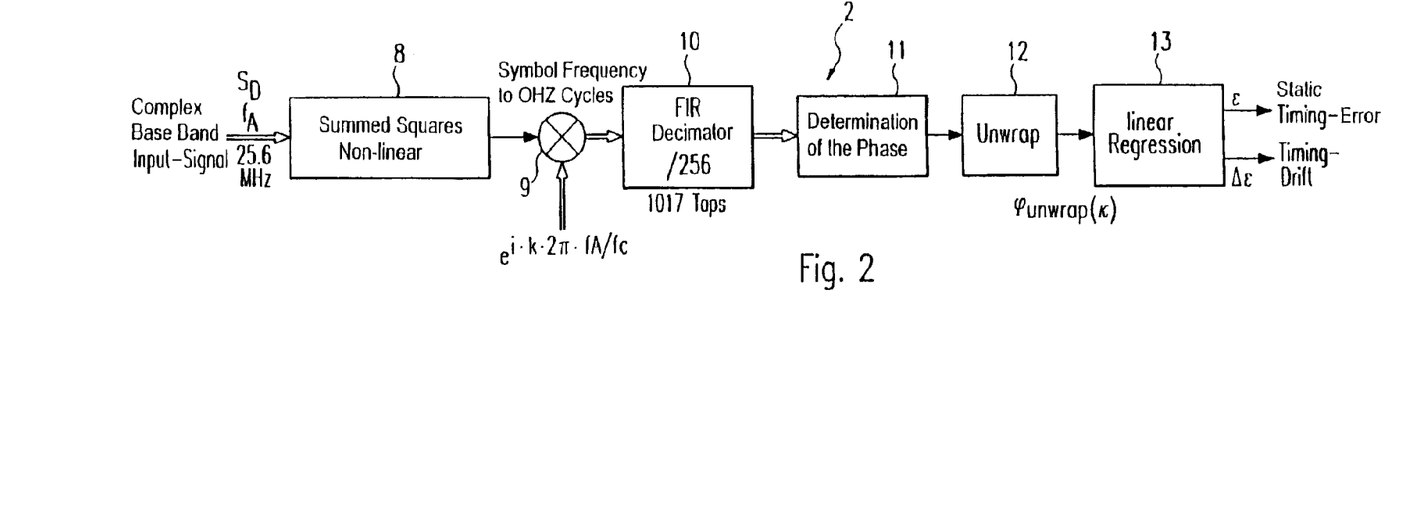
FIG. 2 is a detailed block diagram of the correction apparatus of this invention.

In a thereon-following phase recording, or determining, device 11 the phase of the output signal of the decimating device 10 is recorded as a function of the sampling value, or function of the time. In this regard, it is important that no jumps take place at area boundaries of, for example, +180° to −180°, rather that the phases at the area boundaries be continuously updated. This can take place in a known manner, for example, by ignoring the transfer of arithmetic and logic unit, that is, unwrap, which is illustrated by element 12.

Finally, a linear regression of the phase as a function of the sampling value is performed. A resulting compensation straight line resulting therefrom can, for example, be determined by the method of the smallest sum of the resilient squares (Summe der Federquadrate). As is further shown below in more detail, the static timing offset or timing error $\epsilon$ can be gotten from an axis portion of the compensation straight line. The timing drift $\Delta\epsilon$ can be estimated from the slope of the compensation straight line. The linear regression is illustrated by the element 13.

The signal is described in more detail below using FIGS. 4, 5, 6, 8 and 9 respectively after each of the individual processing steps.

Figure 4:
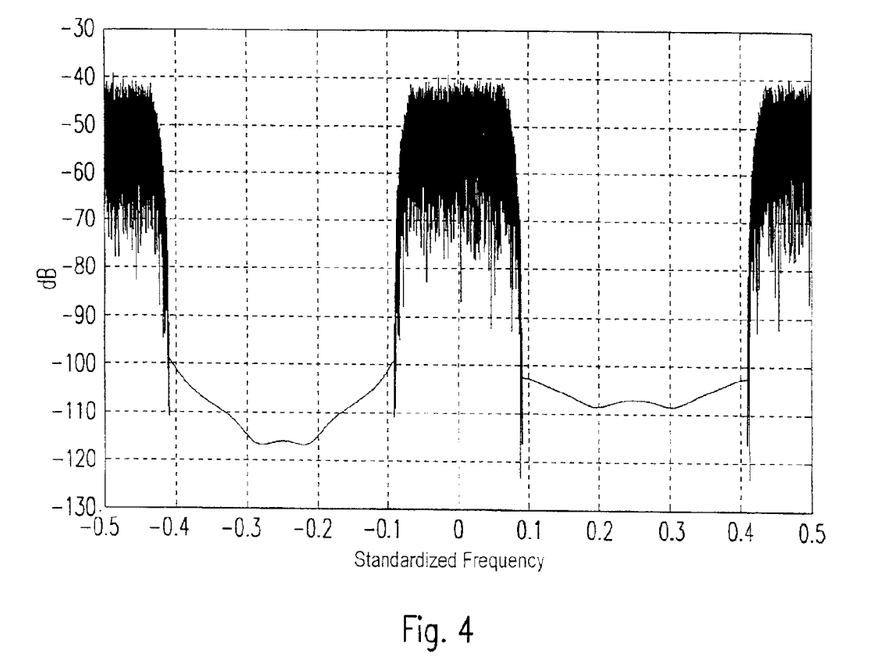
FIG. 4 is a graph of a spectrum of the input signal.
Figure 5:
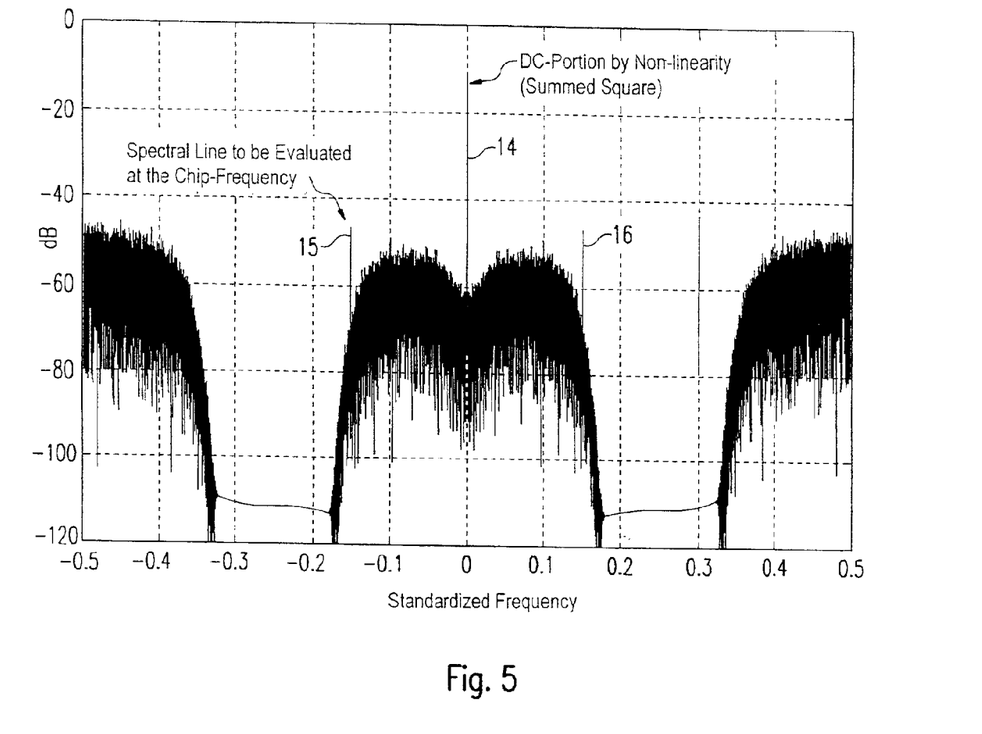
FIG. 5 is a graph of a squared spectrum of the input signal.

FIG. 4 shows a spectrum of the input signal $S_D$ sampled with the sampling rate $f_A$ as a function of a standardized frequency. FIG. 5 shows the spectrum at the output of the non-linear operating element 8, with here the non-linear operating element 8 having carried out the summed squares. In this regard, three spectral lines are shown to result from the non-linear operation. A first spectral line 14, at a zero frequency, originates in the direct voltage portion (DC portion), which arises from the summed-squares operation. A second spectral line 15 is further evaluated with the process of this invention. Assuming the timing drift $\Delta\epsilon$ is zero, this spectral line lies exactly at the chip frequency $f_C$. In addition to this described spectral line 15 at $-f_C$, a mirrored spectral line 16 arises at $+f_C$.

Figure 6:
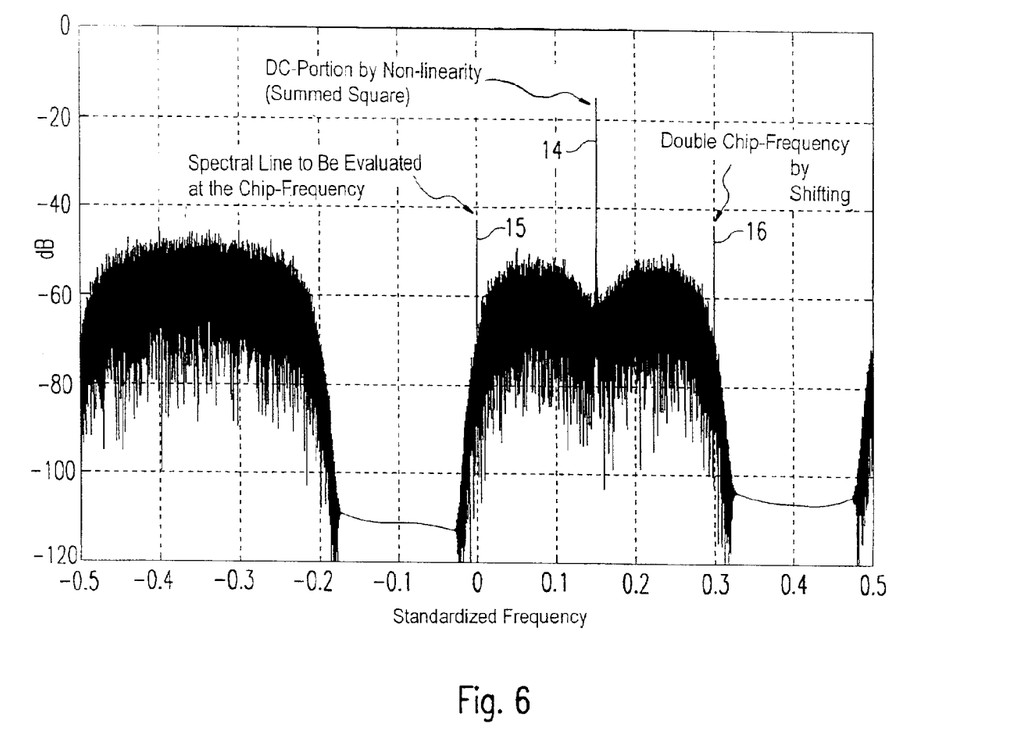
FIG. 6 is a graph of a squared and shifted spectrum of the input signal.
Figure 8:
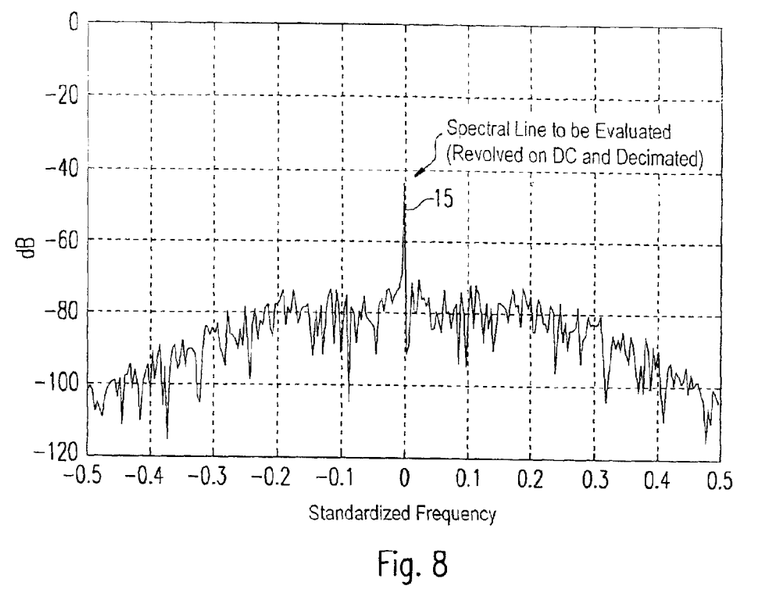
FIG. 8 is a graph of a spectrum of the squared and shifted input signal after a decimation of the sampling values.

FIG. 6 shows a spectrum at the output of the frequency shifter 9. This spectrum agrees with that of FIG. 5, however, it is shifted by the rate $f_C$ so that the spectral line 15 is exactly zero, if no error appears and the timing drift $\Delta\epsilon$ is zero. If the timing drift $\Delta\epsilon$ differs from zero, the spectral line 15 deviates from the frequency zero. A possibility for determining this frequency deviation could be interpolation of the maximum of the spectral line 15 to directly determine the middle frequency of the spectral line 15. This solution, however, has proven to be relatively expensive. Thus, instead, according to this invention, it is suggested that a time-domain evaluation be performed in which the phase be subjected to a linear regression as a function of the time, or as a function of the sampling time points. Before this, however, the number of the sampling values (samples) are reduced, or decimated. The spectrum of the decimated sampled values is shown in FIG. 8. By employing a band limitation during decimation a noise/audible spectrum is narrowed so that a signal/noise relationship is greatly improved, as is clearly shown by a comparison between the noise-amplitudes in FIG. 6 and FIG. 8, relative to the amplitudes of the spectral lines 15. This brings about also a reduced noise amplitude in the phase characteristic curve in the time domain.

Figure 9:
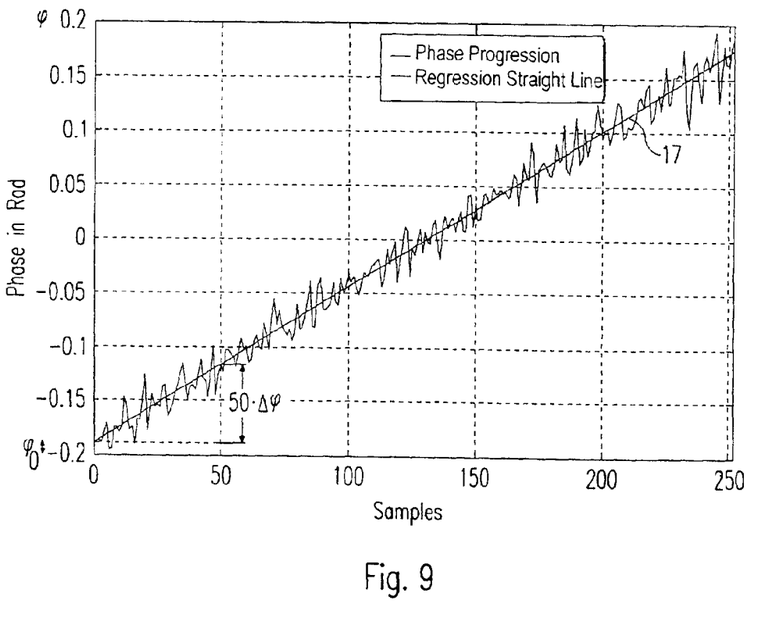
FIG. 9 is a graph of the phase progression, or curve, of the signal represented in FIG. 8 as a function of the sampling values.

In FIG. 9 the phase φ of the signal is represented in the time range as a function of sampling time points (samples) at the output of the decimating device 10, that is, in the area of the spectral line 15. The linear rise of the phase characteristic curve, which is overlaid by a static noise, versus time, can be recognized therein. The compensation straight line 17 can be created, for example, by a minimizing of the sums of the spaced squares, or another regression process. When this is done the axis $\psi_0$ is a measurement for the static timing offset ε. The conversion calculation can be performed with the formula $$\varepsilon = \frac{\varphi_0}{2\pi} \quad (1)$$

The slope of the compensation straight lines 17 is a measurement of the timing drift Δε, wherein the estimated timing drift Δε according to this procedure can be calculated according to the formula $$\Delta\varepsilon = \frac{\Delta\varphi \cdot \frac{f_A}{f_C \cdot \text{dec\_fac}}}{2\pi} \quad (2)$$

In this regard, Δφ is the slope of the compensation straight line 17 per the example, $f_A$ is the sampling rate of the input signal $S_D$, $f_C$ is the chip rate, or the chip frequency, and dec_fac is the decimating factor with which the decimating device 10 decimates the sampling frequency $f_A$ (in the example the dec_fac=256). For illustration purposes, the change in the phase is shown in FIG. 9 as being above 50 sampling values, that is 50·Δφ. It should be kept in mind that, in this regard, the spacing of the sampling values (samples) in FIG. 9 must be converted into the scale of the period $T_C$ of the chip time points, because the decimation of the sampling rate comes to dec_fac/$f_A$, and as is provided by formula (2).

For controlling the resampler 6, the resampling factor, resamp_fac, and the time shift (timing offset), resamp_offset, as is shown in FIG. 1, are used. The conversions into these control values result from the formulas:

$$\text{resamp\_fac} = \frac{f_C}{f_A \cdot (1 + \Delta\varepsilon)} \quad (3)$$

and $$\text{resamp\_offset} = \varepsilon \cdot \frac{f_A}{f_C} \quad (4)$$

By the estimation process of this invention for the static timing offset ε and the timing drift Δε, the control values can therefore be created which correct the sampling rate and the absolute phase position of the resampler 6.

Figure 7:
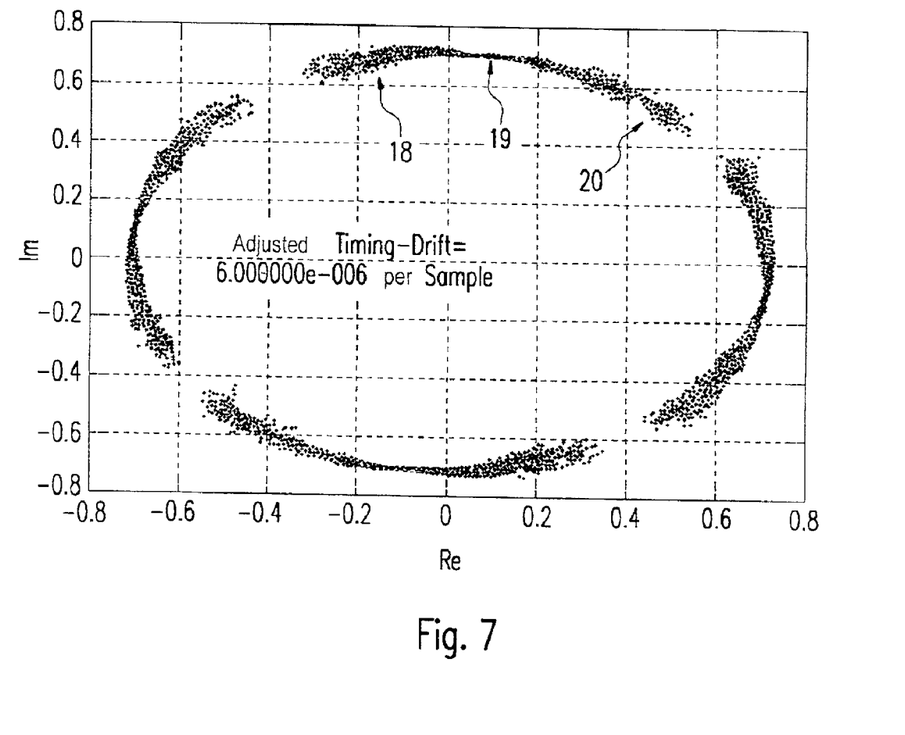
FIG. 7 is a constellation diagram of the input signal.

For further illustration, a status diagram of the input signal $S_D$ is shown in FIG. 7 without the correction of this invention. In this regard, a frequency offset additionally arises so that the phase indicator in the diagram rotates and, therefore, a time characteristic curve of the control can be more clearly seen. It can be recognized that in an area 18 a relatively high scattering appears that converges in an area 19 and diverges in an area 20. With the correction of this invention there is a concentration of this scattering on an ideal circular line that after correction of the frequency offset can be reduced in the status diagram to the ideal four status points.

Figure 10:
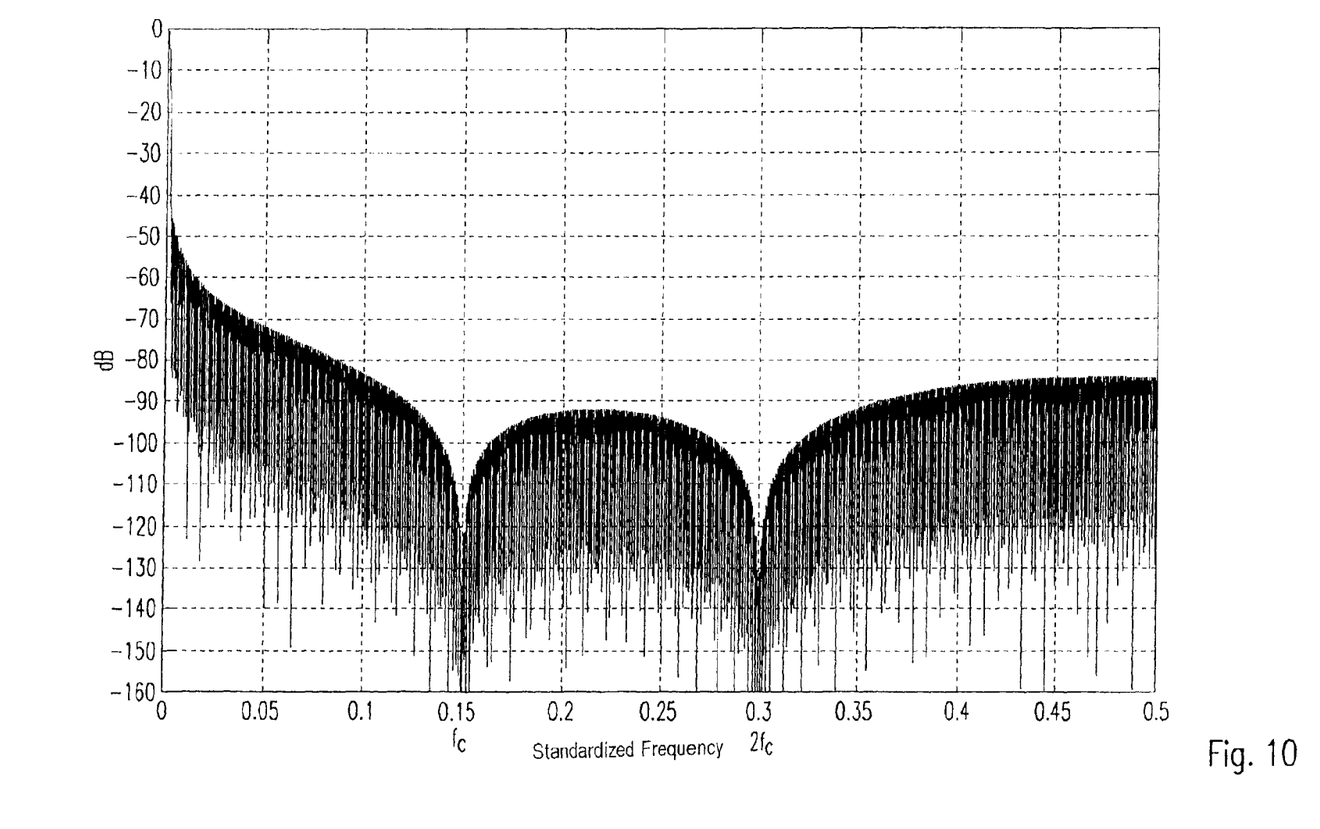
FIG. 10 is a graph of the frequency response of a filter used to decimate the sampling values.

For further illustration, FIG. 10 shows the frequency response of the filter used in the decimating device 10. It can be recognized, in this regard, that the frequency response at the chip frequency $f_C$ and the double chip frequency $2f_C$, that is at the spectral lines 14 and 16, has zero positions, so as to suppress an influence to the estimation result from the spectral lines 14 and 16.

We claim:

1. A process for correcting a resampler (6) with which a sampled input signal ($S_D$), which is subjected to an input sampling rate ($f_A$) and which has one of symbol and chip frequencies ($f_C$) that deviates from the input sampling rate ($f_A$), is converted to a sampled output signal ($S_C$), for which an output sampling rate corresponds with the one of the symbol and chip frequencies by changing the input sampling rate ($f_A$) by a resampling factor (resamp_fac), the process including the following process steps:

performing (8) a non-linear operation on the input signal ($S_D$), so that a spectral line (15) arises at the one of the symbol and chip frequencies;

spectrally shifting (9) the input signal ($S_D$) by the one of the symbol and chip frequencies ($f_C$);

determining (11) the phase (φ) of the shifted spectral line (15) at the one of the symbol and chip frequencies ($f_C$) as a function of the sample time points; and correcting one of the resampling factor (resamp_fac) and a time shift of the output signal ($S_C$) by a time correction value (resamp_offset) based on a regression of the phase (φ) of the shifted spectral line (15) at the one of the symbol and chip frequencies ($f_C$) as a function of the sample time points.

2. The process of claim 1, wherein the non-linear operation is a squaring.

3. The process of claim 1, wherein the regression of the phase (φ) of the shifted spectral line (15) at the symbol or chip frequency ($S_C$) is performed as a function of the sample time points.

4. The process of claim 3, wherein the regression produces a compensation straight line (17);

wherein the resampling factor (resamp_fac) is corrected on the basis of a slope (Δφ) of the compensation straight line (17); and wherein the time correction value (resamp_offset) is corrected on the basis of an axis ($\phi_0$) defining the compensation straight line (17).

5. The process of claim 1, wherein before the phase (φ) is determined a decimation (10) of the sampling value is performed by a preceding band limitation.

6. The process of claim 5, wherein the decimation (10) of the sampling value is performed by a filter whose frequency response has zero positions at at least the one of the symbol and chip frequencies ($f_C$) and at double the at least one of the symbol and chip frequencies ($2f_C$).

7. An apparatus (2) for correcting a resampler (6) in which a sampled input signal ($S_D$), which has been subjected to an input sampling rate and which has one of symbol and chip frequencies ($f_C$) which deviates from the input sampling rate, is converted into a sampled output signal ($S_C$), for which the sampling rate corresponds to the one of the symbol and chip frequencies ($f_C$), by changing the input sampling rate ($f_A$) by a resampling factor (resamp_fac), comprising:

a non-linear operating element (8) that subjects the input signal ($S_D$) to a non-linear operation so that a spectral line (15) results at the one of the symbol and chip frequencies ($f_C$);

a frequency shifter (9), which spectrally shifts the input signal ($S_D$) by the one of the symbols and chip frequencies ($f_C$);

a phase determining device (11) that determines the phase (φ) of the shifted spectral line (15) at the one of the symbol and chip frequencies ($f_C$) as a function of the sampling time points; and a regression and correcting device (13) that, on the basis of a regression of the phase (φ) of the shifted spectral line (15) at the one of the symbol and chip frequencies ($f_C$), performs one of: correcting the resampling factor (resamp_fac) as a function of the sample time points and time-wise shifting the output signal ($S_C$) by a time correction value (resamp_offset).

8. The apparatus of claim 7, wherein the non-linear operating element (8) is a squarer.

9. The apparatus of claim 7, wherein a decimating device (10) is provided between the frequency shifter (9) and the phase determining device (11) in which a decimation of the sampling value is performed by sub-sampling with a preceding band limitation.

10. The apparatus of claim 9, wherein the decimating device (10) includes a filter whose frequency response has zero positions at the one of the symbol and chip frequencies ($f_C$) and double the one of the symbol and chip frequencies ($2f_C$).

* * * * *